(12) United States Patent
Lynn

(10) Patent No.: US 6,863,926 B2
(45) Date of Patent: Mar. 8, 2005

(54) CORROSIVE-RESISTANT COATING OVER ALUMINUM SUBSTRATES FOR USE IN PLASMA DEPOSITION AND ETCH ENVIRONMENTS

(76) Inventor: David Mark Lynn, 4050 Chaparral Rd., Eagle, ID (US) 83616

( * ) Notice: Subject to any disclaimer, the term of this patent is extended or adjusted under 35 U.S.C. 154(b) by 0 days.

(21) Appl. No.: 10/346,029

(22) Filed: Jan. 15, 2003

(65) Prior Publication Data

US 2003/0180556 A1 Sep. 25, 2003

Related U.S. Application Data

(60) Provisional application No. 60/348,666, filed on Jan. 15, 2002.

(51) Int. Cl.[7] .............................................. C23C 16/22
(52) U.S. Cl. ........................ 427/250; 427/453; 427/585; 427/249.5; 427/249.15; 427/576
(58) Field of Search .................................. 428/698, 697, 428/699, 701, 702, 469, 408, 336, 472, 472.2; 118/715; 427/252, 453, 250, 596, 585, 249.5, 249.15, 576

(56) References Cited

U.S. PATENT DOCUMENTS 4,475,794 A * 10/1984 Baker et al. ................. 427/534
6,620,520 B2 * 9/2003 O'Donnell et al. .......... 428/469

* cited by examiner

*Primary Examiner*—Jennifer McNeil
(74) *Attorney, Agent, or Firm*—Angus C. Fox, III

(57) ABSTRACT

A method and apparatus are provided for protecting internal aluminum components of a plasma reactor from plasma-induced erosion. The components are coated, first with a dielectric layer, then with a thin layer of one or more metals selected from the group consisting of gold, chromium, platinum, silver and rhenium. The dielectric layer may either be grown or deposited. The metal layer is deposited, preferably using evaporative deposition.

20 Claims, 1 Drawing Sheet

CORROSIVE-RESISTANT COATING OVER ALUMINUM SUBSTRATES FOR USE IN PLASMA DEPOSITION AND ETCH ENVIRONMENTS

This application has a priority date based on Provisional Patent Application No. 60/348,666, filed Jan. 15, 2002.

BACKGROUND OF THE INVENTION

1. Field of the Invention

This invention relates generally to plasma deposition and etch equipment used in the fabrication of integrated circuits and, more specifically, to plasma-resistant coatings for use on internal chamber components of such equipment.

2. Description of the Prior Art

The manufacture of integrated circuits from conductive, semiconductive and dielectric materials has spanned a plethora of manufacturing equipment and processing techniques. The deposition of thin films, the application of photoresist mask patterns, and the selective etching of one or more layers, and the removal of residual mask patterns are essential steps in the manufacture of integrated circuits. A variety of techniques are currently used for deposition, etching, and photoresist removal. A typical process may involve the creation of a photoresist mask pattern, a subsequent etching of areas unprotected by the mask pattern, and the removal of the residual photoresist. There are two basic kinds of etches: wet and plasma.

Using a wet etch, a substrate is immersed in a chemical bath that attacks the substrate or the resist. While wet etches are conceptually straightforward, they are almost invariably isotropic. That is, a wet etch proceeds in all directions at the same rate. This leads to undesired lateral etching under the edges of the mask pattern. This undercutting effect limits the dimensional control that can be achieved with a wet etch. As features become smaller with each new generation of integrated circuits, the need to improve dimensional control increases. An additional disadvantage to wet etches is that they require the storage, handling, and disposal of toxic chemicals, such as hydrofluoric acid.

Plasma environments in a reactor chamber provide an alternative processing technology for deposition, etching, resist removal, and the like. A plasma is a nearly electrically neutral ionized gas. It contains a substantial density of free electrons and positively charged ions. To remain ionized, a gas must constantly receive energy to offset the recombination of charged particles which occurs most on the walls of the reactor chamber. Plasmas for anisotropic (single or down-direction) etching are typically generated by applying a radio-frequency (RF) electric field to a gas held at low pressure in a vacuum chamber. The gas pressure must be maintained at a low level so that the collision rate of ions is minimized. Anisotropic plasma etching under conditions far from thermodynamic equilibrium is particularly advantageous in the manufacture of ultra-large-scale integrated circuits, as feature dimensions and sidewall profiles can be much more accurately controlled than would be possible using wet etching. This enables the production of integrated circuit features having sidewalls with a precisely defined location that extend substantially vertically from the edges of the masking layer. This is a critical consideration as the ratio of etch depths to feature size or spacing has increased from considerably less than 1, to 1 or more.

Plasma-enhanced chemical vapor deposition (PECVD) has been developed especially by the electronic industry to deposit various types of coatings on a variety of substrates. The process utilizes the energy of plasma to deposit thin films on substrates at low-temperatures. The plasma, or glow discharge that characterizes the process, is generated in a vacuum chamber. There are two basic PECVD processes: a DC glow discharge process and an RF glow discharge process.

The DC glow discharge is generated by applying an electric potential between two electrodes placed within the reactor under vacuum. In the DC glow discharge process, the negative and positive potentials are generally applied to the substrate and chamber wall, respectively. The substrate is generally heated by the bombardment of ions, thereby preventing independent control of temperature of the substrate.

The RF glow discharge, on the other hand, is generated by applying a radio frequency to one of the electrodes while grounding the other. The electrodes may be placed inside the reaction chamber, or they may also be located outside the reaction chamber provided the chamber is made of a non-conductive material, such as glass, quartz, or the like. Because of the difficulty in generating a stable plasma by RF, most of the commercial reactors use parallel electrodes, which are placed inside the reaction chamber and are designed to coat planar substrates. The substrates to be coated are generally placed on the grounded electrode, which can be heated independent of the RF field. Furthermore, a DC bias can be applied to the substrates to control the reaction mechanism. The parallel plates in the RF plasma reactor are generally placed 2–3 cm apart, making such a reactor unsuitable for uniformly coating 3-dimensional parts.

A major problem encountered in the use of plasma reactor equipment, whether it be etching or deposition equipment is the gradual erosion of metal reactor components which are repeatedly exposed to the plasma during the deposition or etching operations. Many of the internal components are fabricated from aluminum or alloys thereof. Such components may include electrodes, shower heads, grids, focus rings, dispersion plates, gas injectors, shields, clamp rings, wafer lift pins, wafer centering rings, alignment rails, paddles, doors, hangers, hinges, holders, gas diffusers, chucks, screws, nuts, bolts, as well as the plasma, etch and diffusion chambers.

Many U.S. patents describe plasma etch and plasma deposition apparatuses. For example, U.S. Pat. No. 6,013,338 to Takashi Inushima, et al. describes a photo-enhanced enhanced CVD apparatus useful for depositing silicon dioxide films of uniform thickness. Another example is U.S. Pat. No. 5,985,098 to Vladimir E. Leibovich, et al., which describes a plasma reactor apparatus having an improved gas delivery mechanism and a thermally-insulated wafer chuck. Still another example is U.S. Pat. No. 6,190,496 B1 to Stephen P. DeOrnellas, et al., which discloses a plasma etch reactor having rare earth magnets for improved plasma confinement. U.S. Pat. No. 6,291,358 B1 to Sujit Sharan, et al. describes a method of operating a PECVD reactor having a chamber wall, a susceptor, a gas inlet, a showerhead positioned over the susceptor, and a power source for providing RF energy. U.S. Pat. No. 6,143,129 to Stephen E. Savas, et al. discloses a plasma etch reactor having an induction coil surrounding the reactor chamber to which RF power is applied, a split Faraday shield interposed between the induction coil and the reactor chamber, and a separate powered electrode for accelerating ions toward a wafer surface. All of the aforecited U.S. patents describe components internal to the plasma reactor chamber which, if made of anodized aluminum, are subject to erosion to the point where they must be replaced after a given period of use. For the purpose of identifying components within the chambers of both plasma CVD and plasma etch reactors, the cited patents are incorporated herein by reference.

The component erosion problem relegates aluminum components, which are exposed to plasma within the reactor chamber, to the category of expendables. Replacement or repair of the eroded items adds to equipment costs and equipment downtime, both of which translate into increased manufacturing costs.

What is needed is a method for protecting the internal components of plasma etch and deposition chambers from the corrosive effects of the plasma generated therein.

SUMMARY OF THE INVENTION

A method and apparatus are provided for protecting internal aluminum components of a plasma reactor from plasma-induced erosion. The components are coated, first with a dielectric layer, then with a thin layer of one or more metals selected from the group consisting of nickel, palladium, platinum, gold, chromium, silver and rhenium. The dielectric layer may either be grown or deposited. The metal layer is deposited, preferably using evaporative deposition.

Aluminum oxide is commonly used as an insulator on aluminum surfaces. Though creation of an aluminum oxide layer is most easily formed through anodization, the layer may also be sprayed thereon using thermal spray techniques. Alternatively, the dielectric layer may be deposited in a chemical vapor deposition chamber. Other compounds are also contemplated as a dielectric layer. Boron carbide, silicon carbide, silicon dioxide, silicon nitride, CVD diamond, aluminum silicates, glass ceramics, and any other insulating material which can withstand the maximum operating temperatures of a plasma reactor, and which can be deposited either using thermal spray techniques or in a chemical vapor deposition process, is considered a viable candidate. For example, boron carbide may be sprayed on the aluminum components as a plasma spray. It is also contemplated that fluorocarbon polymer layers may be used as the dielectric layer.

After the components have been completely covered with an appropriate dielectric layer, a metal selected from the group above is deposited thereon using evaporative techniques to achieve uniform thickness and complete coverage. It is contemplated that in the metal deposition step, metals having a purity of at least about 99.99 percent will be used.

BRIEF DESCRIPTION OF THE DRAWINGS

The drawing figures are meant only to be illustrative of the process and an aluminum substrate so treated. In no way are they intended to limit the scope of the invention as hereinafter described and claimed.

PREFERRED EMBODIMENT OF THE INVENTION

In order to protect aluminum components, which are utilized within plasma reactor chambers, from plasma erosion over time, the components are coated first with a dielectric layer, then with a metal barrier layer. The metal is selected from the group consisting of nickel, palladium, platinum, gold, chromium, silver and rhenium.

Figure 1:
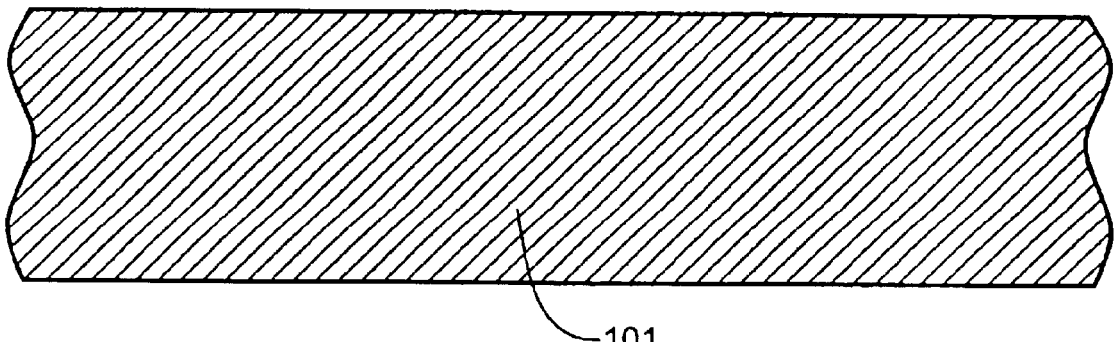
FIG. 1 is a cross-sectional view of an untreated aluminum substrate.

Referring now to FIG. 1, an aluminum substrate 101 is shown prior to the protective treatment process.

Figure 2:
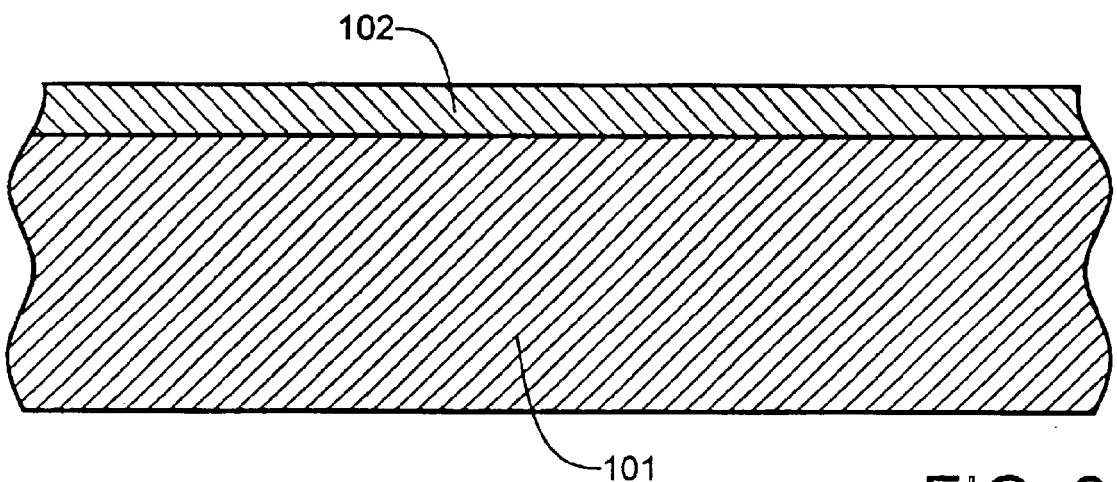
FIG. 2 is a cross-sectional view of the aluminum substrate of FIG. 1 after the upper surface has been coated with a dielectric layer.

Referring now to FIG. 2, the upper surface of aluminum substrate 101 of FIG. 1 has been coated with a dielectric layer 102 having a thickness within a range of about 0.127 mm (0.0005 in.) to 0.0762 mm (0.003 in.). Although in certain cases, a dielectric layer having a thickness of less than 0.127 mm may be adequate, it is essential that the dielectric layer be sufficiently thick to provide an adequate safety margin against electrical breakdown for the voltage levels employed within the reactor. The minimum thickness of each type of dielectric layer will depend on the dielectric constant of the material, as well as the quality of the layer, with respect to pin holes, cracks, and other imperfections.

Anodization is an electrolytic oxidation process where the aluminum serves as the anode. During the anodization process, a thin layer of very hard and brittle aluminum oxide is grown on the aluminum components. The process tends to be self-limiting, as the rate of the oxidation process is roughly proportional to the thickness of the oxide layer. For this reason, the growth of thick oxide layers is a very slow process. A problem inherent to the anodization of non-planar surfaces is that stresses build up within the aluminum oxide layer, and the thicker the layer, the greater the stress. Of course, stress levels cannot build indefinitely. During the anodization of convex surfaces, the aluminum oxide layer tends to fracture because the outer surface area of the layer expands as the layer increases in thickness at the interface between the aluminum oxide layer and the unoxidized aluminum below. On concave surfaces, the aluminum oxide layer tends to spall because the outer surface is compressed as the layer increases in thickness. These micro-cracks and chips damage the dielectric integrity of an otherwise sound aluminum oxide layer. As a result of the problems inherent to anodization, it is deemed preferable to form a dielectric layer on an aluminum substrate by some other means. For example, aluminum oxide powder may be melted and deposited with a plasma gun having an operating temperature in the range of 5–6 KF. Other comparable thermal deposition techniques may also be used. Alternatively, an aluminum oxide layer may be deposited in a chemical vapor deposition chamber. Other compounds are also contemplated as a dielectric layer. Boron carbide, silicon carbide, silicon dioxide, silicon nitride, CVD diamond, aluminum silicates, glass ceramics, and any other insulating material which can withstand the maximum operating temperatures of a plasma reactor, and which can be deposited either as a plasma generated from the powdered material or deposited using a chemical vapor deposition process, is considered a viable candidate. For example, boron carbide may be sprayed on the aluminum components as a plasma spray. It is also contemplated that a composite dielectric layer comprised of two or more layers of different dielectric materials formed sequentially (e.g., silicon dioxide and silicon nitride) be used. It is also contemplated that a composite dielectric layer comprised of two or more different dielectric materials formed simultaneously in using plasma spray or chemical vapor deposition. It is further contemplated that fluorocarbon polymer layers, deposited via chemical vapor deposition, be used as the dielectric layer.

Figure 3:
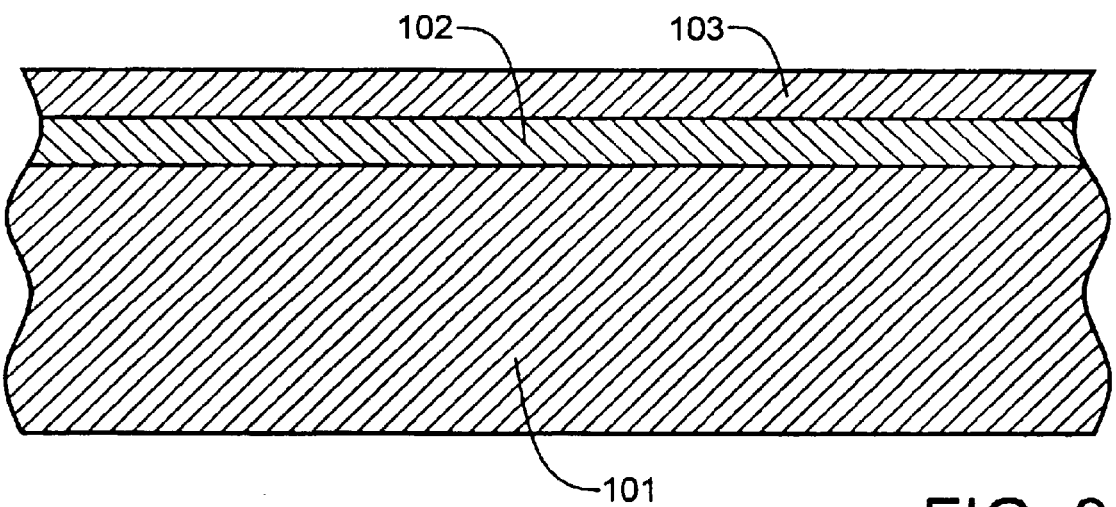
FIG. 3 is a cross-sectional view of the substrate of FIG. 2, following the deposition of a metal layer on top of the dielectric layer.

Referring now to FIG. 3, after the substrate 101 has been completely covered with an appropriate dielectric layer 102, a metal layer 103 is deposited on top of the dielectric layer

102. The metal for the metal layer 103 is selected from the group consisting of nickel, palladium, platinum, gold, chromium, silver and rhenium. The metal layer 103 is deposited preferably using evaporative techniques to achieve uniform thickness and complete coverage. It is contemplated that in the metal deposition step, metals having a purity of at least about 99.99 percent will be used. Alternatively, the metal may be deposited using a chemical vapor deposition process. The metal layer 103 preferably has a minimum thickness within a range of about 0.0508 mm to 0.0762 mm (0.002 to 0.003 in.). It is also contemplated that a composite metal layer comprised of two or more sequentially deposited layers of different metals be used. It is further contemplated that a metal layer comprising two or more different metals deposited simultaneously be used.

The protective metal coatings identified above have been tested on a plasma etcher having a 1,000 watt, 13.56 mhz RF power source using a range of temperatures between 0 and 300 degrees Centigrade and a range of pressures between 1 and 30 torr. The following etch chemistries have been tested: halocarbon 14,23/116 (200 sccm/max); argon (10 slm/max); boron trichloride (200 sccm max); nitrogen trifluoride (200 sccm/max); sulfur hexafluoride (200 sccm/max); hydrogen chloride (200 sccm/max); hydrogen bromide (200 sccm/max). Tests to date indicate that greatly increased life expectancies are achieved for aluminum chamber components, treated in accordance with the procedures of the present invention, and exposed to plasma, as compared to similar items which have been merely anodized.

Although only several embodiments of the protective coating are disclosed herein, it will be obvious to those having ordinary skill in the art that changes and modifications may be made thereto without departing from the scope and the spirit of the invention.

What is claimed is:

1. A method for creating a protective layer on aluminum components used in a plasma chambers, including the steps of:
   coating the substrate with a dielectric layer, which is a composite of at least two different dielectric materials deposited simultaneously; and
   coating the dielectric layer with a layer of metal selected from the group consisting of nickel, palladium, platinum, chromium, silver and rhenium.

2. The method of claim 1, wherein said dielectric layer is deposited via chemical vapor deposition.

3. The method of claim 1, wherein said dielectric layer is deposited via thermal spraying.

4. The method of claim 3, wherein said dielectric layer is melted and deposited using a plasma gun.

5. The method of claim 1, wherein said dielectric layer has a thickness within a range of about 0.0127 mm to 0.0762 mm.

6. The method of claim 1, wherein said dielectric layer comprises a fluorocarbon polymer.

7. The method of claim 1, wherein said dielectric layer contains at least one dielectric material selected from the group consisting of boron carbide, silicon carbide, silicon dioxide, silicon nitride, CVD diamond, aluminum silicates, and glass ceramics.

8. The method of claim 1, wherein said metal layer has a thickness within a range of about 0.0508 mm to 0.0762 mm.

9. The method of claim 1, wherein said metal layer is deposited using a process selected from the group consisting of chemical vapor deposition and evaporative techniques.

10. The method of claim 1, wherein said metal layer is a composite of at least two different metals deposited simultaneously.

11. A method for creating a protective layer on aluminum components used in a plasma chambers, including the steps of:
    coating the substrate with a dielectric layer; and
    coating the dielectric layer with a metal layer, said metal layer bring a composite of at least two different metals, said two different metals being selected from the group consisting of nickel, palladium, platinum, chromium, silver and rhenium, and being deposited simultaneously using evaporative deposition.

12. The method of claim 11, wherein said dielectric layer is deposited via chemical vapor deposition.

13. The method of claim 11, wherein said dielectric layer is created via anodization.

14. The method of claim 11, wherein said dielectric layer is deposited via thermal spraying.

15. The method of claim 14, wherein said dielectric layer is melted and deposited using a plasma gun.

16. The method of claim 11, wherein said dielectric layer has a thickness within a range of about 0.0127 mm to 0.0762 mm.

17. The method of claim 11, wherein said dielectric layer is a composite of at least two layers of different dielectric materials formed sequentially.

18. The method of claim 11, wherein said dielectric layer is a composite of at least two different dielectric materials deposited simultaneously.

19. The method of claim 11, wherein said dielectric layer contains at least one dielectric material selected from the group consisting of boron carbide, silicon carbide, silicon dioxide, silicon nitride, CVD diamond, aluminum silicates, glass ceramics, and fluorocarbon polymers.

20. The method of claim 11, wherein said metal layer has a thickness within a range of about 0.0508 mm to 0.0762mm.

* * * * *